United States Patent
Vartanian et al.

(10) Patent No.: US 9,448,632 B2
(45) Date of Patent: *Sep. 20, 2016

(54) MOBILE DEVICE WITH A PRESSURE AND INDENTATION SENSITIVE MULTI-TOUCH DISPLAY

(71) Applicant: HJ Laboratories Licensing, LLC, Bryn Mawr, PA (US)

(72) Inventors: Harry Vartanian, Bryn Mawr, PA (US); Jaron Jurikson-Rhodes, Philadelphia, PA (US)

(73) Assignee: HJ Laboratories Licensing, LLC, Bryn Mawr, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/145,766

(22) Filed: May 3, 2016

(65) Prior Publication Data
US 2016/0246380 A1    Aug. 25, 2016

Related U.S. Application Data

(63) Continuation of application No. 14/485,246, filed on Sep. 12, 2014, now Pat. No. 9,335,824, which is a continuation of application No. 13/291,375, filed on Nov. 8, 2011, now Pat. No. 8,866,766, which is a continuation of application No. 12/406,273, filed on Mar. 18, 2009, now Pat. No. 8,686,951.

(51) Int. Cl.
| | |
|---|---|
| G06F 3/01 | (2006.01) |
| G06F 3/041 | (2006.01) |
| H01H 13/85 | (2006.01) |

(52) U.S. Cl.
CPC ............ *G06F 3/016* (2013.01); *G06F 3/0412* (2013.01); *G06F 3/0416* (2013.01); *H01H 13/85* (2013.01); *G06F 2203/04104* (2013.01); *G06F 2203/04809* (2013.01); *H01H 2215/052* (2013.01); *H01H 2217/006* (2013.01); *H01H 2217/038* (2013.01)

(58) Field of Classification Search
None
See application file for complete search history.

(56) References Cited

U.S. PATENT DOCUMENTS

| | | |
|---|---|---|
| 4,871,992 A | 10/1989 | Petersen |
| 5,327,457 A | 7/1994 | Leopold |
| 5,402,490 A | 3/1995 | Mihm, Jr. |
| 5,412,189 A | 5/1995 | Cragun |
| 5,463,657 A | 10/1995 | Rice |
| 5,490,087 A | 2/1996 | Redden et al. |

(Continued)

FOREIGN PATENT DOCUMENTS

| | | |
|---|---|---|
| EP | 676781 B1 | 1/1999 |
| GB | 2382291 A | 5/2003 |

(Continued)

OTHER PUBLICATIONS

"Apple Introduces the Incredible Shape Shifting Device Interface," Patently Apple, Jun. 24, 2010.

(Continued)

*Primary Examiner* — Joseph Haley
*Assistant Examiner* — Emily Frank
(74) *Attorney, Agent, or Firm* — Volpe and Koenig, P.C.

(57) ABSTRACT

A view may be displayed on a multi-touch display based on force from a detected touch to a tactile point and an indentation of a clear layer. A detailed view related to the view may also be displayed on the multi-touch based on a detected further indentation of the tactile point.

11 Claims, 8 Drawing Sheets

(56) References Cited

U.S. PATENT DOCUMENTS

| | | |
|---|---|---|
| 5,504,938 A | 4/1996 | Redden |
| 5,602,901 A | 2/1997 | Redden et al. |
| 5,673,256 A | 9/1997 | Maine |
| 5,712,870 A | 1/1998 | Petrick |
| 5,724,659 A | 3/1998 | Daniel et al. |
| 5,752,162 A | 5/1998 | Sawyer et al. |
| 5,825,308 A | 10/1998 | Rosenberg |
| 5,867,144 A | 2/1999 | Wyard |
| 5,867,789 A | 2/1999 | Olds et al. |
| 5,888,161 A | 3/1999 | McCarrick et al. |
| 5,892,902 A | 4/1999 | Clark |
| 6,004,049 A | 12/1999 | Knox |
| 6,037,882 A | 3/2000 | Levy |
| 6,075,967 A | 6/2000 | Naimark et al. |
| 6,104,922 A | 8/2000 | Baumann |
| 6,117,296 A | 9/2000 | Thomson |
| 6,131,032 A | 10/2000 | Patel |
| 6,140,913 A | 10/2000 | Okada et al. |
| 6,185,536 B1 | 2/2001 | Haber et al. |
| 6,204,896 B1 | 3/2001 | Matsuhira et al. |
| 6,243,078 B1 | 6/2001 | Rosenberg |
| 6,255,938 B1 | 7/2001 | Bornschein |
| 6,266,690 B1 | 7/2001 | Shankarappa et al. |
| 6,359,978 B1 | 3/2002 | Brady |
| 6,434,702 B1 | 8/2002 | Maddalozzo, Jr. et al. |
| 6,456,245 B1 | 9/2002 | Crawford |
| 6,462,840 B1 | 10/2002 | Kravtsov |
| 6,487,657 B1 | 11/2002 | Brockmann |
| 6,492,979 B1 | 12/2002 | Kent et al. |
| 6,535,201 B1 | 3/2003 | Cooper et al. |
| 6,559,620 B2 | 5/2003 | Zhou et al. |
| 6,563,487 B2 | 5/2003 | Martin et al. |
| 6,571,102 B1 | 5/2003 | Hogberg et al. |
| 6,597,347 B1 | 7/2003 | Yasutake |
| 6,628,511 B2 | 9/2003 | Engstrom |
| 6,646,540 B1 | 11/2003 | Lussey |
| 6,680,731 B2 | 1/2004 | Gerpheide et al. |
| 6,700,553 B2 | 3/2004 | Becker et al. |
| 6,703,550 B2 | 3/2004 | Chu |
| 6,782,102 B2 | 8/2004 | Blanchard et al. |
| 6,787,238 B2 | 9/2004 | Zhang et al. |
| 6,823,787 B1 | 11/2004 | Saueressig |
| 6,842,428 B2 | 1/2005 | Chen et al. |
| 6,842,607 B2 | 1/2005 | Godfrey et al. |
| 6,852,416 B2 | 2/2005 | Zhang et al. |
| 6,859,569 B2 | 2/2005 | Ishibashi et al. |
| 6,881,063 B2 | 4/2005 | Yang |
| 6,882,086 B2 | 4/2005 | Kornbluh et al. |
| 6,888,161 B2 | 5/2005 | Shih |
| 6,925,495 B2 | 8/2005 | Hegde et al. |
| 6,988,247 B2 | 1/2006 | Janevski |
| 7,027,311 B2 | 4/2006 | Vanderelli et al. |
| 7,042,711 B2 | 5/2006 | Tanaka et al. |
| 7,042,997 B2 | 5/2006 | Jones |
| 7,050,835 B2 | 5/2006 | Hack et al. |
| 7,054,145 B2 | 5/2006 | Tanaka et al. |
| 7,077,015 B2 | 7/2006 | Hayward et al. |
| 7,102,621 B2 | 9/2006 | Roberts |
| 7,109,967 B2 | 9/2006 | Hioki et al. |
| 7,113,177 B2 | 9/2006 | Franzen |
| 7,138,985 B2 | 11/2006 | Nakajima |
| 7,151,527 B2 | 12/2006 | Culver |
| 7,184,032 B2 | 2/2007 | Stohrer et al. |
| 7,186,356 B2 | 3/2007 | Lussey et al. |
| 7,193,350 B1 | 3/2007 | Blackburn et al. |
| 7,253,807 B2 | 8/2007 | Nakajima |
| 7,269,153 B1 | 9/2007 | Schultz et al. |
| 7,274,652 B2 | 9/2007 | Webster et al. |
| 7,301,435 B2 | 11/2007 | Lussey et al. |
| 7,317,872 B1 | 1/2008 | Posa et al. |
| 7,339,572 B2 | 3/2008 | Schena |
| 7,352,356 B2 | 4/2008 | Roberts et al. |
| 7,368,307 B2 | 5/2008 | Cok |
| 7,377,133 B2 | 5/2008 | Sandbach et al. |
| 7,382,357 B2 | 6/2008 | Panotopoulos et al. |
| 7,400,640 B2 | 7/2008 | Fischer et al. |
| 7,406,057 B2 | 7/2008 | Isomaki et al. |
| 7,408,872 B2 | 8/2008 | Palin et al. |
| 7,436,318 B2 | 10/2008 | Affolter et al. |
| 7,444,157 B2 | 10/2008 | Hovers et al. |
| 7,455,304 B2 | 11/2008 | Porter |
| 7,461,353 B2 | 12/2008 | Rohrabaugh et al. |
| 7,495,348 B2 | 2/2009 | Mund et al. |
| 7,511,702 B2 | 3/2009 | Hotelling |
| 7,522,153 B2 | 4/2009 | Ohtsuka |
| 7,548,232 B2 | 6/2009 | Shahoian et al. |
| 7,554,045 B2 | 6/2009 | Sandbach et al. |
| 7,554,051 B2 | 6/2009 | Crispin |
| 7,561,141 B2 | 7/2009 | Shahoian et al. |
| 7,567,243 B2 | 7/2009 | Hayward |
| 7,592,999 B2 | 9/2009 | Rosenberg et al. |
| 7,593,067 B2 * | 9/2009 | Taguchi ............... G06F 3/0436 345/173 |
| 7,656,394 B2 | 2/2010 | Westerman et al. |
| 7,731,670 B2 | 6/2010 | Aguirre-Ollinger et al. |
| 7,756,297 B2 | 7/2010 | Pryor |
| 7,787,646 B2 | 8/2010 | Pelrine et al. |
| 7,841,944 B2 | 11/2010 | Wells |
| 7,893,928 B2 | 2/2011 | Im |
| 7,953,462 B2 | 5/2011 | Harry |
| 7,982,588 B2 | 7/2011 | Makinen et al. |
| 8,068,101 B2 | 11/2011 | Goertz |
| 8,095,879 B2 | 1/2012 | Goertz |
| 8,125,463 B2 | 2/2012 | Hotelling et al. |
| 8,136,402 B2 | 3/2012 | Cato |
| 8,169,416 B2 | 5/2012 | Han |
| 8,232,973 B2 | 7/2012 | Kocienda et al. |
| 8,255,323 B1 | 8/2012 | Casey et al. |
| 8,406,816 B2 | 3/2013 | Marui et al. |
| 8,433,138 B2 | 4/2013 | Wang et al. |
| 8,547,339 B2 * | 10/2013 | Ciesla ................... G06F 3/0202 345/156 |
| 8,558,803 B2 | 10/2013 | Park et al. |
| 8,593,409 B1 * | 11/2013 | Heubel ................ G06F 3/041 340/407.1 |
| 8,619,051 B2 | 12/2013 | Lacroix et al. |
| 8,686,952 B2 | 4/2014 | Burrough et al. |
| 8,773,356 B2 | 7/2014 | Martin et al. |
| 8,825,113 B2 | 9/2014 | Kim et al. |
| 2002/0158836 A1 * | 10/2002 | Ishmael, Jr. ............ G06F 3/016 345/156 |
| 2003/0038776 A1 | 2/2003 | Rosenberg et al. |
| 2003/0058265 A1 | 3/2003 | Robinson et al. |
| 2004/0056877 A1 * | 3/2004 | Nakajima ............... G06F 3/016 715/702 |
| 2004/0100448 A1 | 5/2004 | Moshrefzadeh |
| 2004/0199232 A1 | 10/2004 | Wallace et al. |
| 2005/0088417 A1 | 4/2005 | Mulligan |
| 2005/0157893 A1 | 7/2005 | Pelrine et al. |
| 2006/0007078 A1 | 1/2006 | Lee et al. |
| 2006/0022955 A1 | 2/2006 | Kennedy |
| 2006/0092344 A1 | 5/2006 | Ura et al. |
| 2006/0096392 A1 | 5/2006 | Inkster et al. |
| 2006/0103634 A1 | 5/2006 | Kim et al. |
| 2006/0186802 A1 | 8/2006 | Cok et al. |
| 2006/0197752 A1 | 9/2006 | Hurst et al. |
| 2006/0197753 A1 | 9/2006 | Hotelling |
| 2006/0209083 A1 | 9/2006 | Rosenberg |
| 2006/0221016 A1 | 10/2006 | Nakamura |
| 2007/0020589 A1 | 1/2007 | Smith et al. |
| 2007/0085838 A1 | 4/2007 | Ricks et al. |
| 2007/0091070 A1 | 4/2007 | Larsen et al. |
| 2007/0106949 A1 | 5/2007 | Narita et al. |
| 2007/0139391 A1 | 6/2007 | Bischoff |
| 2007/0152962 A1 | 7/2007 | Kim et al. |
| 2007/0152974 A1 | 7/2007 | Kim et al. |
| 2007/0182708 A1 | 8/2007 | Poupyrev et al. |
| 2007/0193267 A1 | 8/2007 | He |
| 2007/0200496 A1 | 8/2007 | Cok et al. |
| 2007/0220427 A1 | 9/2007 | Briancon et al. |
| 2007/0247422 A1 | 10/2007 | Vertegaal et al. |
| 2007/0247429 A1 | 10/2007 | Westerman |
| 2007/0257891 A1 | 11/2007 | Esenther et al. |
| 2008/0005703 A1 | 1/2008 | Radivojevic et al. |

(56) References Cited

U.S. PATENT DOCUMENTS

| | | |
|---|---|---|
| 2008/0062088 A1 | 3/2008 | Chang et al. |
| 2008/0122589 A1 | 5/2008 | Ivanov |
| 2008/0129705 A1 | 6/2008 | Kim et al. |
| 2008/0136786 A1 | 6/2008 | Lanfermann |
| 2008/0150911 A1 | 6/2008 | Harrison |
| 2008/0180399 A1 | 7/2008 | Cheng |
| 2008/0180406 A1 | 7/2008 | Han et al. |
| 2008/0211353 A1 | 9/2008 | Seeley et al. |
| 2008/0224948 A1 | 9/2008 | Alberth |
| 2008/0231610 A1 | 9/2008 | Hotelling et al. |
| 2008/0246726 A1 | 10/2008 | Gettemy |
| 2008/0259236 A1 | 10/2008 | Kwon et al. |
| 2008/0291521 A1 | 11/2008 | Kim et al. |
| 2008/0291525 A1 | 11/2008 | Kim et al. |
| 2008/0303795 A1 | 12/2008 | Lowles et al. |
| 2009/0002140 A1 | 1/2009 | Higa |
| 2009/0002205 A1 | 1/2009 | Klinghult et al. |
| 2009/0002328 A1 | 1/2009 | Ullrich et al. |
| 2009/0015560 A1 | 1/2009 | Robinson et al. |
| 2009/0043195 A1 | 2/2009 | Poland |
| 2009/0061948 A1 | 3/2009 | Lee et al. |
| 2009/0070711 A1 | 3/2009 | Kwak |
| 2009/0102805 A1 | 4/2009 | Meijer et al. |
| 2009/0153368 A1 | 6/2009 | Hur et al. |
| 2009/0160813 A1 | 6/2009 | Takashima et al. |
| 2009/0167704 A1 | 7/2009 | Terlizzi et al. |
| 2009/0174671 A1 | 7/2009 | Tachi et al. |
| 2009/0174687 A1 | 7/2009 | Ciesla et al. |
| 2009/0181724 A1 | 7/2009 | Pettersson |
| 2009/0182501 A1 | 7/2009 | Fyke et al. |
| 2009/0189748 A1 | 7/2009 | Bergere |
| 2009/0189873 A1 | 7/2009 | Peterson et al. |
| 2009/0189878 A1 | 7/2009 | Goertz et al. |
| 2009/0195512 A1 | 8/2009 | Pettersson |
| 2009/0213066 A1 | 8/2009 | Hardacker et al. |
| 2009/0231271 A1 | 9/2009 | Heubel et al. |
| 2009/0237364 A1 | 9/2009 | Bloomcamp et al. |
| 2009/0256807 A1 | 10/2009 | Nurmi |
| 2009/0256857 A1 | 10/2009 | Davidson et al. |
| 2009/0286211 A1 | 11/2009 | Eisenhardt et al. |
| 2009/0303022 A1 | 12/2009 | Griffin et al. |
| 2009/0309851 A1 | 12/2009 | Bernstein |
| 2009/0315830 A1 | 12/2009 | Westerman |
| 2010/0001973 A1 | 1/2010 | Hotelling et al. |
| 2010/0007613 A1 | 1/2010 | Costa |
| 2010/0085169 A1 | 4/2010 | Poupyrev et al. |
| 2010/0103115 A1* | 4/2010 | Hainzl .................. G06F 3/0414 345/173 |
| 2010/0115448 A1 | 5/2010 | Lysytskyy et al. |
| 2010/0128002 A1 | 5/2010 | Stacy et al. |
| 2010/0151426 A1 | 6/2010 | Tachi et al. |
| 2010/0156803 A1 | 6/2010 | Wu |
| 2010/0156818 A1 | 6/2010 | Burrough et al. |
| 2010/0162109 A1 | 6/2010 | Chatterjee et al. |
| 2010/0171715 A1 | 7/2010 | Peterson et al. |
| 2010/0177050 A1 | 7/2010 | Heubel et al. |
| 2010/0177055 A1 | 7/2010 | Ookawara et al. |
| 2010/0182245 A1 | 7/2010 | Edwards et al. |
| 2010/0207775 A1 | 8/2010 | Lenneman et al. |
| 2010/0207902 A1 | 8/2010 | Juan et al. |
| 2010/0225456 A1 | 9/2010 | Eldering |
| 2010/0231540 A1 | 9/2010 | Cruz-Hernandez et al. |
| 2010/0231541 A1 | 9/2010 | Cruz-Hernandez et al. |
| 2010/0238116 A1 | 9/2010 | Shin |
| 2010/0238117 A1 | 9/2010 | Fitzgibbon et al. |
| 2010/0283731 A1 | 11/2010 | Grant et al. |
| 2010/0295820 A1 | 11/2010 | Kikin-Gil |
| 2011/0043485 A1 | 2/2011 | Goertz |
| 2011/0199342 A1 | 8/2011 | Vartanian et al. |

FOREIGN PATENT DOCUMENTS

| | | |
|---|---|---|
| JP | 2001117721 A | 4/2001 |
| KR | 20040076415 A | 9/2004 |
| KR | 20080023901 A | 3/2008 |
| TW | 594183 B | 6/2004 |
| WO | 9917929 A1 | 4/1999 |
| WO | 2007012899 A1 | 2/2007 |
| WO | 2007114699 A1 | 10/2007 |
| WO | 2008037275 A1 | 4/2008 |
| WO | 2010054014 A1 | 5/2010 |
| WO | 2010085575 A1 | 7/2010 |

OTHER PUBLICATIONS

"Artificial muscles get a makeover," accessed at http://www.msnbc.msn.com/id/11858650/, Mar. 16, 2006.

"Artificial Muscles," Nov. 23, 2006.

"Electric Flex," (2001) Date Unknown, accessed at http://www.Spectrumieee.org/print/1579.

"Fundamental research on polymer material as artificial muscle," Apr. 1, 2008 (Abstract).

"Materials and Technologies for Artificial Muscle: A Review for the Mechatronic Muscle Project," Date Unknown.

"New Class of Composite Organic Material Could Put the Muscle in Artificial Body Parts," Sep. 19, 2002.

"New Polymers and Nanotubes Add Muscle to Prosthetic Limbs," Aug. 1999.

"PulseTouch™technology," Date Unknown.

"Refreshable Braille Display," Date Unknown.

"Small jolts move artificial muscle," Oct. 2-9, 2002.

"Sony's Flexible OLED," accessed at http://www.youtube.comiwatch?v=NcAm3KihFho Date. Unknown.

"Team post Braille ebook concept," bit-tech.net, Apr. 21, 2009.

"Two Dimensional Radiation Pressure Tactile Display," Aug. 8-10, 2005.

"Unusual material that contracts when heated is giving up its secrets to physicists," Nov. 18, 2004.

"W&M Professor Heads Facility Studying Piezoelectric Material," Jul. 6, 2001.

3DTV Experience—Philips WOWvx 3D Display; Date Unknown.

Amemiya et al., "Portable Haptic Feedback Display for Virtual Reality," 1999, Abstract Only.

"Artificial Muscle Material with Fast Electroactuation under Neutral pH Conditions, " Abstract Only, May 21, 2004.

Bau, et al., "BubbleWrap: A Textile-Based Electromagnetic Haptic Display", CHI 2009, Apr. 4-9, 2009, Boston, Massachusetts, USA.

Chouvardas et al., "Tactile display applications: a state of the art survey," 2005.

Chouvardas et al., "Tactile Displays: a short overview and recent developments," 2007.

Davies, C., "Nhk develop precise haptic-feedback touchscreen," Slashgear, May 16, 2008.

Harrison et al., "Texture Displays: A Passive Approach to Tactile Presentation," Apr. 9, 2009.

Howe, R., "The Haptic Community Web Site—Haptic Research: Tactile Display", Apr. 3, 2002.

Vijayan, J., "User interfaces: The next generation," Aug. 9, 2004.

Khoudja et al., "Tactile interfaces: a state-of-the-art survey," CEA List SRSI, 2004, France.

Kim et al., "Small and Lightweight Tactile Display (SaLT) and its Application," Third Joint Eurohaptics Conference and Symposium on Haptic Interfaces for Virtual Environment and Teleoperator Systems, Mar. 18-20, 2009, pp. 69-74, Salt Lake City, UT, USA.

"NC State Scientists Engineer 'Pumped-Up,' Materials," accessed Sep. 6, 2007.

Doshita et al., "Tokyo University Realizes Light-weight, Flexible Braille Display Sheet Using Organic Transistors," Nov. 25, 2005.

"Patent: TouchEngine: A Tactile Display for Handheld Devices" Date Unknown.

Poupyrev et al., "Haptic feedback for pen computing: directions and strategies," 2004, Abstract Only.

Sharifi et al., "Design and implementation of a graphic-haptic display system", Nov. 24, 2006.

Shinoda et al. "A Tactile Feeling Display Based on Selective Stimulation of Skin Receptors", Proceedings of the IEEE Virtual Reality Annual International Symposium, Mar. 1998, pp. 36-42, Atlanta, Georgia, USA.

(56) References Cited

OTHER PUBLICATIONS

Shinoda et al., "Two Dimensional Stress Reproduction Using Ultrasound Tactile Display," SICE-ICASE International Joint Conference 2006, Oct. 18-21, 2006, pp. 4818-4821, Bexco, Busan, Korea.
Shinoda et al., "Two-dimensional Scanning Tactile Display using Ultrasound Radiation Pressure", 14th Symposium on Haptic Interfaces for Virtual Environment and Teleoperator Systems, pp. 57-61, Mar. 25-26, 2006.
Shinohara et al., "A blind person's interactions with technology," Communications of the ACM, vol. 52, No. 8, pp. 58-66, Aug. 2009.
Stone, R., "Haptic Feedback: A Potted History, From Telepresence to Virtual Reality," 2007, UK.
Hasser, "Tactile Feedback for a Force-Reflecting Haptic Display," Dec. 1995, Abstract Only.
Gizmodo, "Braille E-Reader Concept Raises Dots with E-Ink," Apr. 20, 2009.
Response to Non-final Office Action from U.S. Appl. No. 12/406,273 dated Sep. 21, 2011.
"TPaD: Tactile Pattern Display (2007)," Mar. 27, 2007.
Wright, J., "Next for Touchscreens: Temporary Pop-Up Buttons?," Popular Mechanics, Aug. 2009.
Zyga, L., "Researchers Design Band-Aid-Size Tactile Display," PHYSORG.Com, Jun. 6, 2006.
Notice of Allowance from U.S. Appl. No. 13/291,375 dated Oct. 4, 2013.
Non-final Office Action from U.S. Appl. No. 12/406,273 dated Jun. 22, 2011.
Response to Office Action from U.S. Appl. No. 12/406,273 dated Jan. 16, 2012.
Final Office Action from U.S. Appl. No. 12/406,273 dated Apr. 2, 2012.
Response to Final Office Action from U.S. Appl. No. 12/406,273 dated Jul. 2, 2012.
Notice of Allowance from U.S. Appl. No. 12/406,273 dated Aug. 28, 2013.
Notice of Allowance from U.S. Appl. No. 12/406,273 dated Dec. 13, 2013.
Applicant-Initiated Interview Summary from U.S. Appl. No. 12/406,273 dated Nov. 20, 2013.
Applicant-Initiated Interview Summary from U.S. Appl. No. 12/406,273 dated Jan. 3, 2012.
Notice of Allowance from U.S. Appl. No. 13/291,375 dated Jun. 6, 2014.
Examiner initiated interview summary from U.S. Appl. No. 13/291,375 dated Jun. 16, 2014.
Applicant-Initiated Interview Summary from U.S. Appl. No. 13/291,375 dated May 30, 2014.
Applicant-Initiated Interview Summary from U.S. Appl. No. 13/291,375 dated Mar. 30, 2012.
Applicant-Initiated Interview Summary from U.S. Appl. No. 13/291,375 dated Feb. 2, 2012.
Minsky, Margaret Diane Rezvan. "Computational haptics: the sandpaper system for synthesizing texture for a force-feedback display." PhD diss., Queen's University, 1995.
Massie, Thomas H., and J. Kenneth Salisbury. "The phantom haptic interface: A device for probing virtual objects." In Proceedings of the ASME winter annual meeting, symposium on haptic interfaces for virtual environment and teleoperator systems, vol. 55, No. 1. 1994.
Blackberry Storm User Guide, Version 4.7, 2008, 249 pages.
Blackberry SurePress Touch Screen, http://global.blackberry.com/en/devices/specifications/communication/surepress-touch-screen.html, Nov. 2008.
Sony's Flexible OLED, accessed at http://www.youtube.com/watch?v=NcAm3KihFho, Uploaded on Jun. 27, 2007.
TouchEngine: A Tactile Display for Handheld Devices Proceedings of CHI 2002, Extended Abstracts. 2002: ACM: pp. 544-645.
Artificial Muscle Material with Fast Electroactuation under Neutral pH Conditions, Abstract Only, May 21, 2004.
Ooshita et al., "Tokyo University Realizes Light-weight, Flexible Braille Display Sheet Using Organic Transistors," Nov. 25, 2005.
Non-final Office Action from U.S. Appl. No. 14/485,246 dated Aug. 19, 2015.
Notice of Allowance from U.S. Appl. No. 14/485,246 dated Mar. 7, 2016.
Notice of Allowance from U.S. Appl. No. 15/060,016 dated Jun. 8, 2016.
Notice of Allowance from U.S. Appl. No. 15/061,580 dated Jun. 6, 2016.
Notice of Allowance from U.S. Appl. No. 15/079,660 dated Jun. 23, 2016.
Notice of Allowance from U.S. Appl. No. 15/080,025 dated Jul. 13, 2016.

* cited by examiner

US 9,448,632 B2

MOBILE DEVICE WITH A PRESSURE AND INDENTATION SENSITIVE MULTI-TOUCH DISPLAY

CROSS REFERENCE TO RELATED APPLICATIONS

This application is a continuation of U.S. patent application Ser. No. 14/485,246 filed Sep. 12, 2014, which is a continuation of U.S. patent application Ser. No. 13/291,375 filed Nov. 8, 2011, which issued as U.S. Pat. No. 8,866,766 on Oct. 21, 2014, which is a continuation of U.S. patent application Ser. No. 12/406,273 filed Mar. 18, 2009, which issued as U.S. Pat. No. 8,686,951 on Apr. 1, 2014, the contents of which are all hereby incorporated by reference herein as if fully set forth.

FIELD OF INVENTION

This application is related to an apparatus and method for providing and configuring an elevated, indented, or texturized display device. Moreover, processes are provided and described involving elevated, indented, or texturized portions of a display device.

BACKGROUND

Display devices have become commonplace in electronic devices such as mobile devices, cellular phones, personal digital assistants, smart phones, televisions, monitors, touchscreens, picture frames, or the like. Display devices may be based on liquid crystal, plasma, or organic light emitting technologies using ridged substrates or soon to be flexible substrates. Although commonplace, when a display device functions as an input device, such as a touchscreen, their applications are limited to two dimensions. Another limitation or problem of current display devices is the lack of texture. As the world becomes more electronic, texture is needed for enhancing and enabling certain applications and computer processes. Therefore, it is desirable to have display devices that can provide three dimensional and/or texturized structures or processes.

SUMMARY

An apparatus and method for providing and configuring an elevated, indented, or texturized display device is disclosed. Processes are also given involving elevated, indented, or texturized portions of a display device. By providing an elevated, indented, or texturized display device enhanced input/output functions are provided.

BRIEF DESCRIPTION OF THE DRAWINGS

A more detailed understanding may be had from the following description, given by way of example in conjunction with the accompanying drawings wherein.

DETAILED DESCRIPTION

Figure 1:
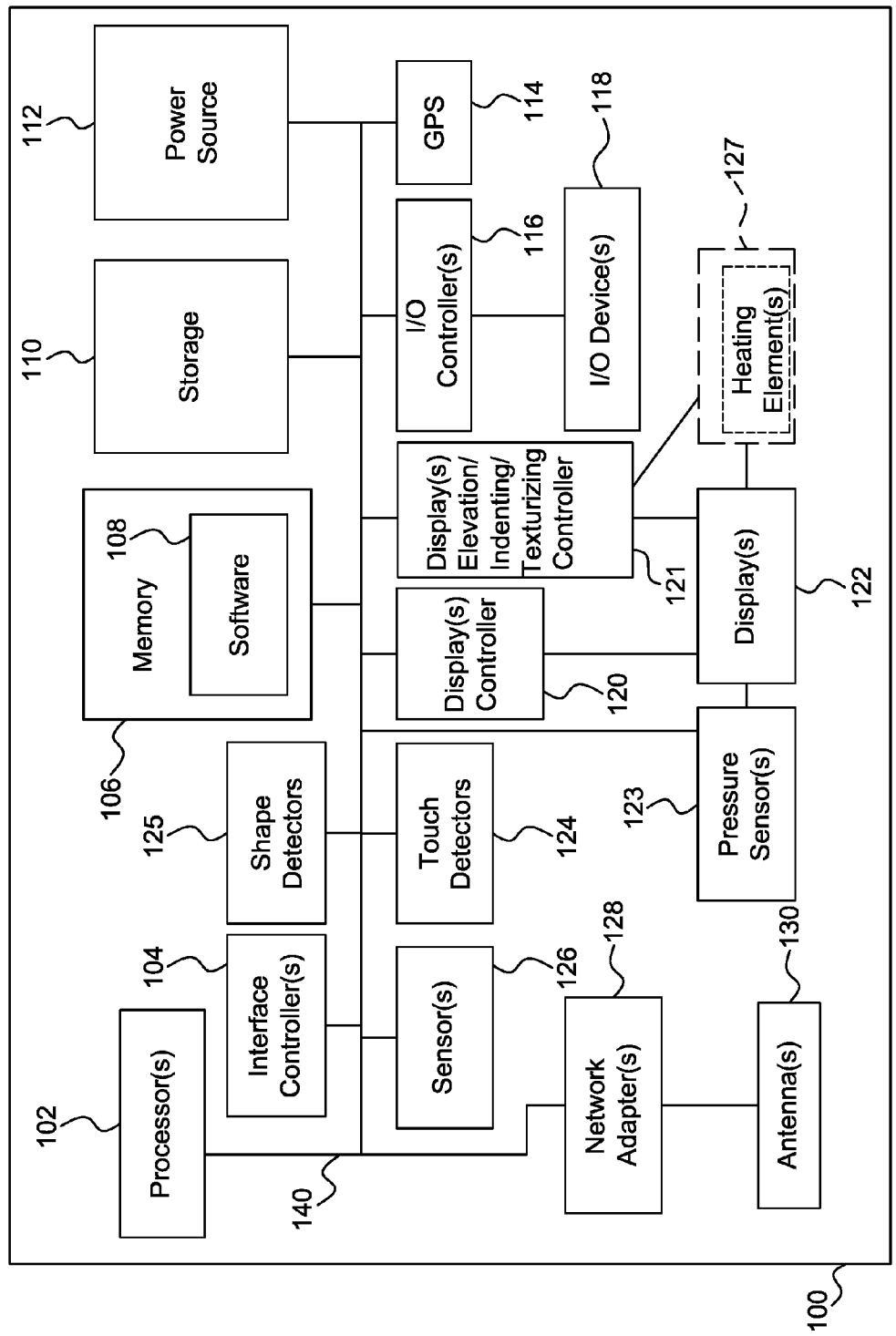
FIG. 1 is a diagram of an electronic device having an elevated, indented, or texturized display device in accordance with one embodiment.

The present invention will be described with reference to the drawing figures wherein like numerals represent like elements throughout. In the description forthcoming, elevation or elevated describes an orientation where a given surface level is higher or raised relative to another surface level. As an example, the relative elevation may be by one or more millimeters to one or more centimeters or up to an inch. Indenting describes an orientation where a given surface level is lower or depressed relative to another surface level. As an example, the relative indentation may be by one or more millimeters to one or more centimeters. Texturizing or texturing describes a process where a surface provides or mimics friction, variable smoothness, sandpaper like granularity, variable thickness, variable hardness, coarseness, fineness, irregularity, a movement sensation, bumpiness, or rigidity that is sensed by a human touch or detectable by electronic or mechanical sensors.

In addition, lines shown in the accompanying figures for areas having elevated, indented, or texturized portions or cells are for illustrative purposes. Actual display devices may not show lines on the display surface. In addition, in the processes described below the steps recited may be performed out of sequence and substeps not explicitly described or shown may be performed by one of ordinary skill in the art.

FIG. 1 is a diagram of a fixed or mobile subscriber unit, user equipment (UE), mobile station, pager, cellular telephone, personal digital assistant (PDA), computing device, surface computer, monitor, general display, automobile computer system, vehicle computer system, or television device 100 for mobile or fixed applications. Device 100 comprises computer bus 140 that couples one or more processors 102, one or more interface controllers 104, memory 106 having software 108, storage device 110, power source 112, one or more displays controller 120. In addition to one or more displays controller 120, device 100 comprises a display(s) elevation, indenting, or texturizing controller 121 for one or more display devices 122.

One or more display devices 122 can be configured as a liquid crystal display (LCD), light emitting diode (LED), field emission display (FED), organic light emitting diode (OLED), or flexible OLED display device. The one or more display devices 122 may be configured, manufactured, produced, or assembled based on the descriptions provided in US Patent Publication Nos. 2007-247422, 2007-139391, 2007-085838, or 2006-096392 or U.S. Pat. No. 7,050,835 or WO Publication 2007-012899 all herein incorporated by reference as if fully set forth. In the case of a flexible display device, the one or more electronic display devices 122 may be configured and assembled using organic light emitting diodes (OLED), liquid crystal displays using flexible substrate technology, flexible transistors, field emission displays (FED) using flexible substrate technology, as desired. One or more display devices 122 can be configured as a touch screen display using resistive, surface-acoustic wave (SAW) capacitive, infrared, strain gauge, optical imaging, dispersive signal technology, acoustic pulse recognition, frustrated total internal reflection or magneto-strictive technology, as understood by one of ordinary skill in the art.

Coupled to one or more display devices 122 are pressure sensors 123 and optionally heating elements 127. Coupled to computer bus 140 are one or more input/output (I/O) controller 116, I/O devices 118, GPS device 114, one or more network adapters 128, and one or more antennas 130. Device 100 may have one or more motion, light, optical, chemical, environmental, water, acoustic, heat, temperature, radio frequency identification (RFID), biometric, face recognition, image, or voice recognition sensors 126 and touch detectors 124 for detecting any touch inputs, including multi-touch inputs, for one or more display devices 122. One or more interface controller 104 may communicate with touch detectors 124 and I/O controller 116 for determining user inputs to device 100.

Shape detectors 125 may be configured in combination with touch detectors 124, display(s) elevation, indenting, or texturizing controller 121, one or more display devices 122, pressure sensors 123, or sensors 126 to determine the shape, geometry or texture of an object placed on one or more display devices 122, as will be explained in more detail below.

Still referring to device 100, storage device 110 may be any disk based or solid state memory device for storing data. Power source 112 may be a plug-in, battery, solar panels for receiving and storing solar energy, or a device for receiving and storing wireless power as described in U.S. Pat. No. 7,027,311 herein incorporated by reference as if fully set forth. One or more network adapters 128 may be configured as a Time Division Multiple Access (TDMA), Code Division Multiple Access (CDMA), Orthogonal Frequency-Division Multiplexing (OFDM), Orthogonal Frequency-Division Multiple Access (OFDMA), Global System for Mobile (GSM) communications, Enhanced Data rates for GSM Evolution (EDGE), General Packet Radio Service (GPRS), cdma2000, wideband CDMA (W-CDMA), long term evolution (LTE), 802.11x, Wi-Max, mobile Wi-MAX, Bluetooth, or any other wireless or wired transceiver for modulating and demodulating information communicated via one or more antennas 130. Additionally, any of devices, controllers, displays, components, etc. in device 100 may be combined, made integral, or separated as desired.

Figure 2A:
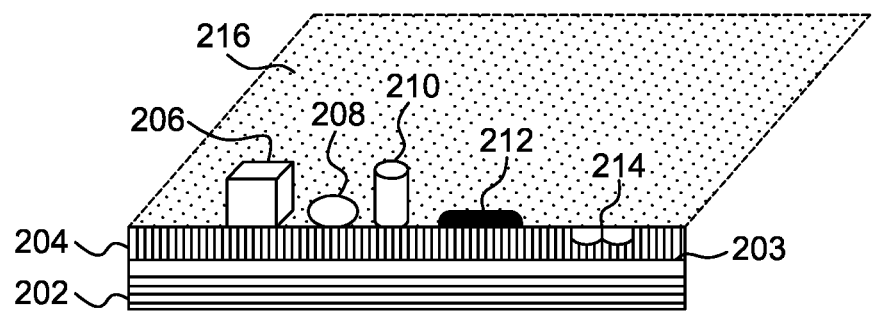
FIGS. 2a-2e are diagrams of elevated, indented, or texturized display devices in accordance with another embodiment.

FIGS. 2a-2e are diagrams of elevated, indented, or texturized display devices. In FIG. 2a layer 204 lays in proximity to display device layer 202 with layer 203 providing separation. Although a single layer is shown, layers 202, 203, and 204 can be composed of a plurality of sublayers. In one embodiment, a particular sublayer within 204 can be transflective to reflect any ambient light and emit white light, such as the average light emitted by surrounding display pixels or cells, so that the displayed image is clear. Display device layer 202 can be either a flexible or rigid display device. Layer 204 can be configured and composed of a clear, flexible, electroactive polymer, polymer composite, or gel material. Electroactive polymers (EAPs), also known as electroactive plastics, can be pulled, expand, contract, deform, change shapes in controllable directions, change dimensions in predetermined directions, or change sizes electronically by applying an electric current, potential difference, voltage, time varying voltage, or electromagnetic fields across the material, as described in U.S. Pat. No. 6,117,296, U.S. Pat. No. 6,787,238, US Patent Publication No. 2008-188907, US Patent Publication No. 2004-199232, US Patent Publication No. 2005-157893, WO Publication 2007-114699 and "*Electric Flex*" by Yoseph Bar-Cohen (2001) all herein incorporated by reference as if fully set forth.

Electroactive polymers (EAPs) may be dielectric or ionic EAPs. For dielectric EAPS, actuation can be caused by electrostatic forces between two electrodes that squeeze or compress the polymer. Although requiring a high actuation voltage, dielectric EAPS consume very little power and require no power to keep an actuator at a given position. Examples of dielectric EAPs are electrostrictive polymers and dielectric elastomers that are used for artificial muscles. For Ionic EAPs, actuation is caused by the displacement of ions inside the polymer. Only a few volts are needed for actuation, but the ionic flow implies a higher electrical power needed for actuation, and energy is needed to keep the actuator at a given position. Examples of ionic EAPS are conductive polymers, ionic polymer-metal composites (IP-MCs), and responsive gels.

In another embodiment, layer 204 can also be configured and composed of piezoelectric materials or actuators that are bonded to a firm plastic component to form a piezo bending element, as explained in "*TPaD: Tactile Pattern Display*" by Colgate and Peshkin (2007) herein incorporated by reference as if fully set forth. When a potential difference is applied to a bonded or constricted piezoelectric material it changes shape. The shape change can be controlled electrically to provide different surface textures, indentation, and elevation.

In another embodiment, layer 204 can also be configured and composed of organic transistors formed on a flexible substrate to drive or contract a surface creating texture, indentation, or elevation. Organic transistors are transistors that use organic molecules rather than silicon for their active material. An advantage of organic transistors is the ability to operate on a flexible substrate. Similar to EAPs, organic transistors also exhibit material properties such that they can be pulled, expand, contract, deform, change shapes in controllable directions, change dimensions in predetermined directions, or change sizes electronically by applying an electric current, potential difference, voltage, time varying voltage, or electromagnetic fields.

Still referring to FIG. 2a, portions of surface 216 are selectively elevated, indented, or texturized with one or more substantially cubicle segment 206, dot or dimple segment 208, substantially cylindrical segment 210, bulge segment 212, or indentation segment 214. The shape and texture of the indented or elevated portion depends on the image, document, or application to be displayed and the effects on the resolution of the display device. Because of their natural geometry, certain segments may provide a clearer display of the underlying image or document. Segments 206, 208, 210, 212, and 214 are controlled at least by displays controller 120 and controller 121 that adjust the height, indentation, or depression to multiple different levels, orientation, hardness, thickness, direction, vibration, or gyration individually for each segment. Display(s) elevation, indenting, or texturizing controller 121 may comprise of analog or digital driving circuits (not shown) for driving the segments. Examples of display driving circuits are given in US Patent Publication Nos. 2008-062088, 2006-221016, or 2006-007078 all herein incorporated by reference as if fully set forth.

In FIG. 2a, the operation and configuration of layer 204 may be independent of display device layer 202 thereby simplifying manufacturing since it can be an add-on or attachment to preexisting display systems or technologies. Also, in certain applications images may not be displayed on surface 216 in an area that is elevated, indented, or texturized thereby making it darkened in order to make the area more noticeable to the user. For this configuration, the image displayed on display device layer 202 is rendered to adjust for the darkened area.

Figure 2B:
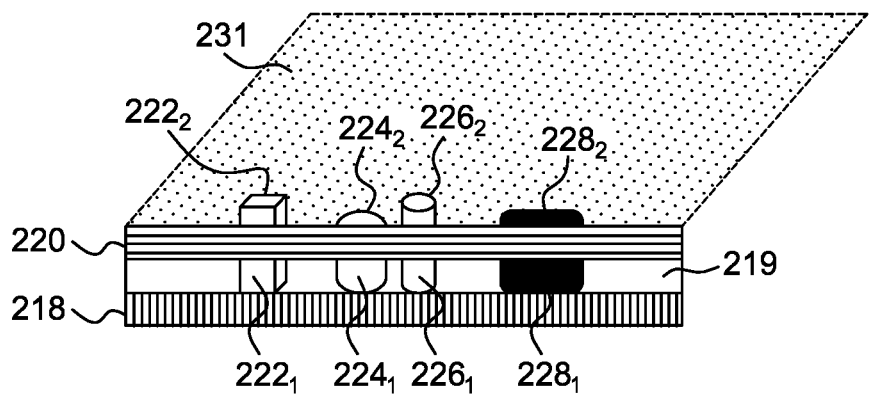

FIG. 2b is a diagram of an elevated or texturized display device. Layer 218 lays in proximity to display device layer 220 with layer 219 providing separation. Although a single layer is shown, layers 218, 219, and 220 may be composed of a plurality of sublayers. Display device layer 220 is configured as a flexible display device, such as flexible OLED. Layer 218 may be comprised of the same composition or materials explained above for layer 204 such as EAPs, piezoelectric materials, or organic transistors.

In FIG. 2b, portions of surface 231 are selectively elevated or texturized with one or more substantially cubicle segment $222_1$ controlling segment $222_2$, dot or dimple segment $224_1$ controlling segment $224_2$, substantially cylindrical segment $226_1$ controlling segment $226_2$, or bulge segment $228_1$ controlling segment $228_2$. Segments $222_2$, $224_2$, $226_2$, and $228_2$ are controlled at least by displays controller 120 and/or controller 121 that adjust the height, orientation, direction, or gyration individually or collectively for each segment. Display(s) elevation, indenting, or texturizing controller 121 may comprise of analog or digital driving circuits (not shown) for driving the segments. Since layer 218 is oriented below or behind display device layer 220, there is little interference with the resolution or clarity of images to be displayed on display device layer 220. Also, in certain applications images may not be displayed on surface 231 in an area that is elevated, indented, or texturized thereby making it darkened in order to make the area more noticeable to the user. For this configuration, the image displayed on display device layer 220 is rendered to adjust for the darkened area.

Figure 2C:
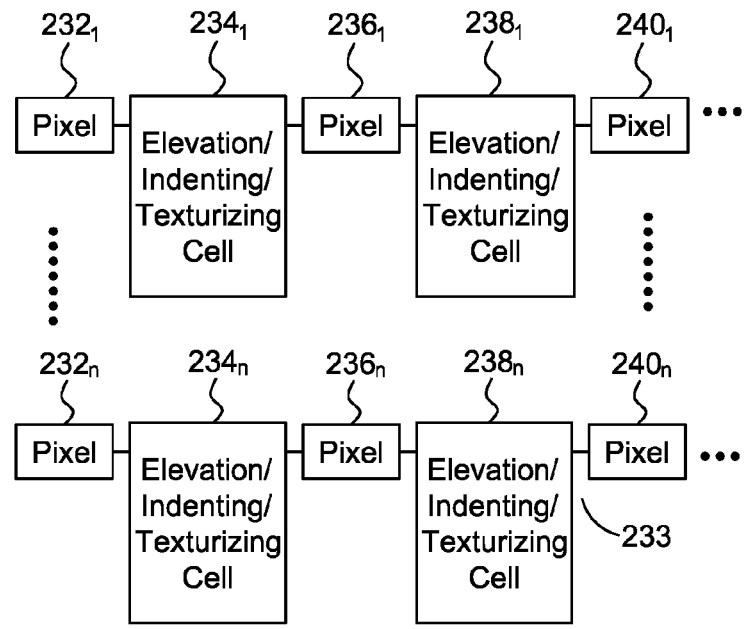

FIG. 2c is a diagram of an elevated, indented, or texturized display device. Display pixels $232_1$ to $232_n$ lay adjacent, on the same level, or on the same layer to elevation, indenting, or texturizing cells $234_1$ to $234_n$. The display array or matrix 233 also comprises of display pixels $236_1$ to $236_n$ adjacent to elevation, indenting, or texturizing cells $238_1$ to $238_n$ that are adjacent to display pixels $240_1$ to $240_n$. The elevation, indenting, or texturizing cells may be comprised of the same composition or materials explained above for layer 204 or 218 such as EAPs, piezoelectric material, or organic transistors. Cells $234_1$ to $234_n$ and $238_1$ to $238_n$ are controlled at least by displays controller 120 and/or controller 121 that adjust the height, orientation, direction, or gyration individually or collectively for each cell. Display(s) elevation, indenting, or texturizing controller 121 may comprise of analog or digital driving circuits (not shown) for driving the cells. In this embodiment, cells $234_1$ to $234_n$ and $238_1$ to $238_n$ may be illuminated based on the configuration of surrounding pixels to blend in with any images being displayed.

Figure 2D:
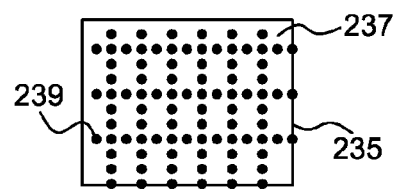

FIG. 2d shows an embodiment of a display device array or matrix 235 from a top view where elevation, indenting, or texturizing cells 239 are placed selectively within a small area footprint so that the surface of display device array or matrix 235 is mostly comprised of display pixels 237. Having texturizing cells 239 sparsely placed in display device array or matrix 235 ensures minimal interference with a displayed image. In this embodiment the elevation, indented, or texturized cells may be unnoticeable to the human eye but detectable by touch or feeling of display device array or matrix 235.

Figure 2E:
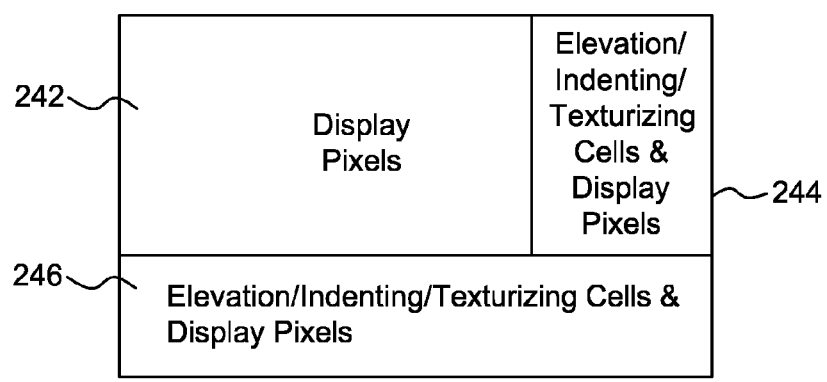

FIG. 2e is a diagram of an elevated, indented, or texturized display device. In FIG. 2e, display pixels 242 are in the same layer or level but separate from elevation, indenting, or texturizing cells and display pixels areas 244 and 246. FIG. 2e provides a hybrid layout with display pixels 242 operating with selectively placed elevation, indenting, or texturizing cells and display pixels 244 and 246. In FIG. 2e, area 244 can provide scrolling functions while area 246 can be configured as a keyboard, dialpad, keypad, or any other interface.

Figure 3:
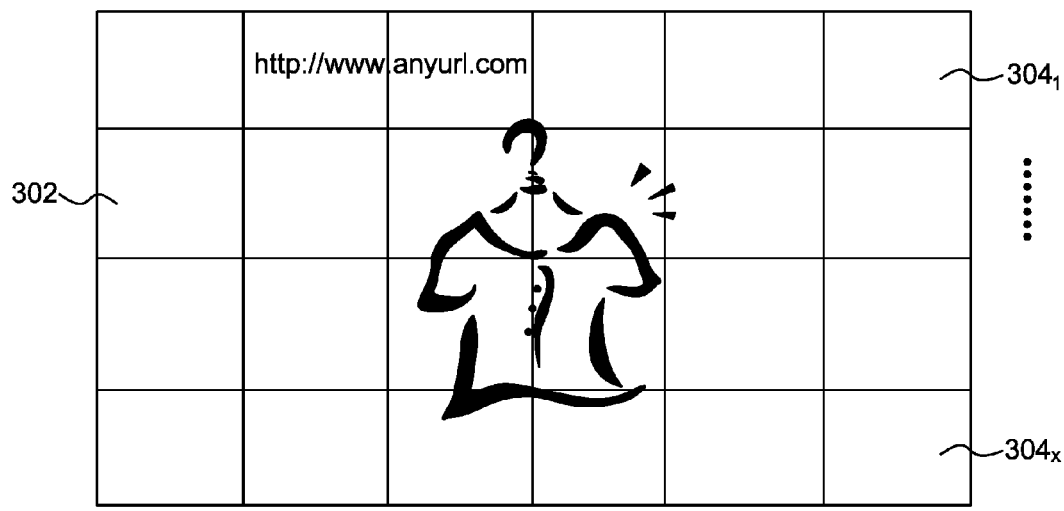
FIG. 3 is a diagram of an elevated or texturized display device in accordance with another embodiment.

FIG. 3 is a diagram of an elevated or texturized display device. A matrix of pockets or cells $304_1$ to $304_x$ lays on top of a display device 302. Matrix of pockets or cells $304_1$ to $304_x$ may be full of compressed air or low heat activated gel that becomes elevated or texturized by heating elements 127 as a result of thermal expansion, as understood by one of ordinary skill in the art. Matrix of pockets or cells $304_1$ to $304_x$ can be tapered but flat and seamless when unexpanded. Moreover, heating elements 127 can be used to provide different tactile sensations in combination with pockets or cells $304_1$ to $304_x$ so that a user is provided varying temperatures, such as hot or cold information, relating to a displayed image.

Figure 4:
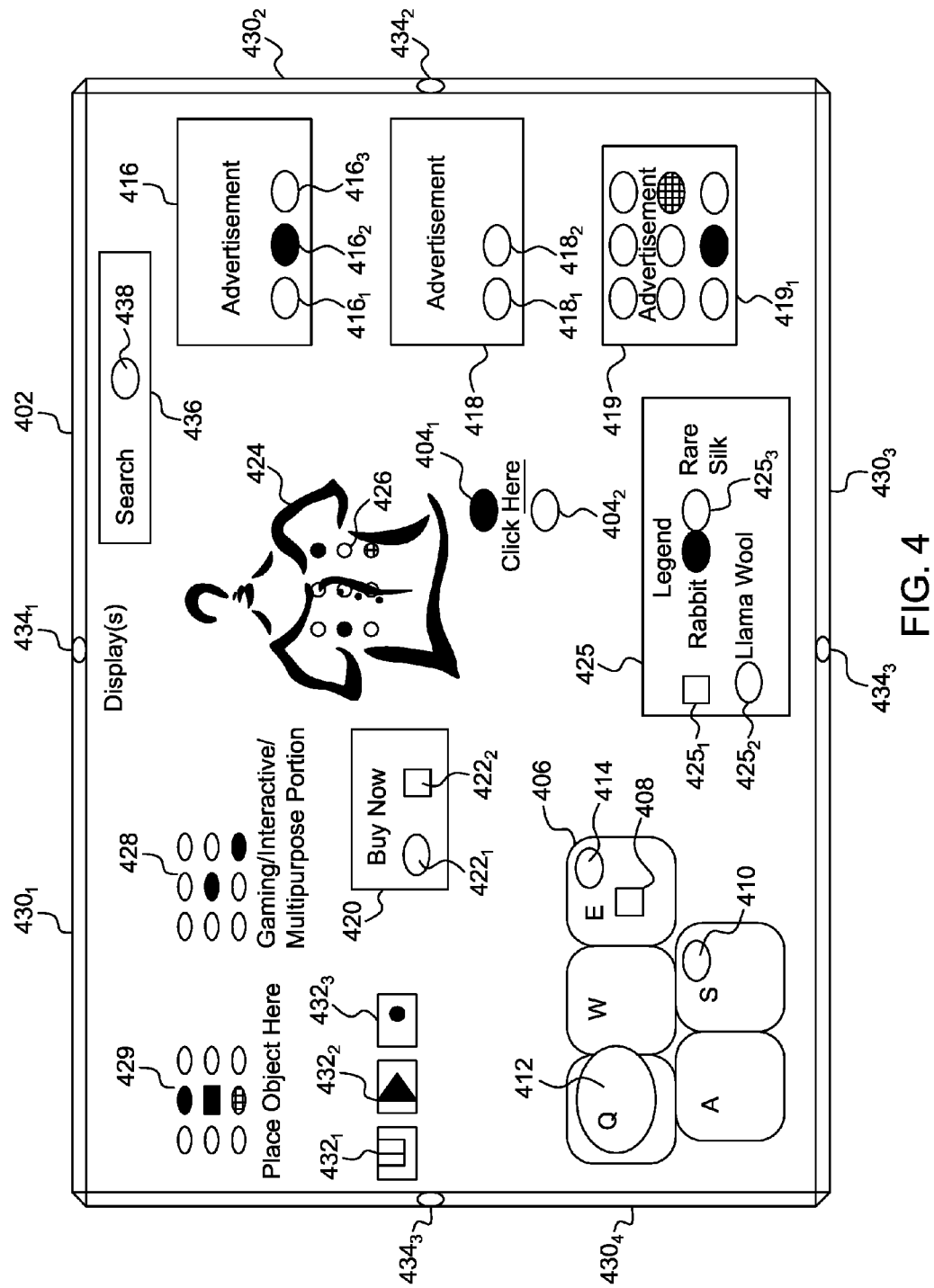
FIG. 4 is a diagram comprising of processes for an electronic device having a display device with elevated, indented, or texturized display portions in accordance with another embodiment.

FIG. 4 is a diagram illustrating processes for an electronic device having a display device 402 with elevated, indented, or texturized display portions. Display device 402 can be assembled with at least some of the components described in device 100. For elevated, indented, or texturized applications, display device 402 may be configured with the devices described in FIG. 2a, 2c, or 2d, as desired. For elevated or certain texturized applications, display device 402 may be configured with the devices described in FIG. 2b or 3, as desired. For illustrative purposes, in FIG. 4 a darkened or black portion represents an indented portion, a white portion represents an elevated portion, and a checkered pattern represents a texturized portion.

For inputting data or triggering a request action, a "click here" displayed link is provided with a combination of an indented portion $404_1$ and elevated portion $404_2$. Moreover, part of a virtual or simulated keyboard displayed on display device 402 provides the letter "E" key with a partially displayed portion 406, an elevated circular portion 414 and an elevated square portion 408. Although part of a virtual or simulated keyboard is shown, display device 402 can be configured to show a whole QWERTY keyboard, a numbered keypad for dialing, or a combination of a whole QWERTY keyboard and a numbered keypad, as desired. The letter "S" key is provided by a partially displayed portion and an elevated circular portion 410. The letter "Q" key is completely elevated by portion 412. The virtual or simulated keyboard can also be programmed to replicate Braille lettering, as desired.

In addition to key inputs, portions 414, 408, 410, or 412 can detect different pressure forces when pushed down, pushed sideways, or pulled sideways providing another metric or advantage for the man machine interface. For instance, a pull in one direction may indicate a capital letter input while a push in another direction may indicate subscripting of the letter. These different pressure forces are detected by pressure sensors 123 in combination with touch detectors 124 and/or display(s) elevation, indenting, or texturizing controller 121 by measuring gradient, force, or potential difference values. Moreover, in response to a detected force by pressure sensors 123 and touch detectors 124, haptic feedback, force feedback or tactile feedback in the form of a played sound, gyration, or vibration can be provided via I/O controller 116.

Still referring to the virtual or simulated keyboard on display device 402, instructions in software 108 can be used to predict or anticipate keystrokes based on a word or sentence entered. In response to the anticipation, different keys can be raised, indented, or texturized in order to increase typing speeds.

An embodiment of the present invention provides electronic advertising processes. Advertisement 416 can be sold to an advertiser for a certain price for having elevated portions $416_1$ and $416_3$ and indentation $416_2$ on at least one part or the entire advertisement. Advertisement 418 can be sold to an advertiser for a different price, higher or lower, for having elevated portions $418_1$ and $418_2$ having different heights from other advertisements and can be based in combination with location determined by GPS device 114. Advertisement 419 can be sold to an advertiser for a different price for having a plurality of elevated, indented, or texturized portions $419_1$.

An embodiment of the present invention provides electronic business processes. A "Buy Now" button is provided with an elevated circular portion $422_1$ and a square portion $422_2$. The "Buy Now" button is associated with triggering the purchasing of shirt 424 by sending a request to a server (not shown) over one or more network adapters 128. For shirt 424, a texturizing portion 426 is provided to replicate or simulate the surface of shirt 424. Texturizing portion 426 can be a combination of elevated and indented cells. Although a shirt 424 is shown, texturizing portion 426 can be used to provide surface information for any product being sold or displayed on display device 402 such as electronics, home goods, jewelry, etc.

Using touch detectors 124 in combination with display(s) elevation, indenting, or texturizing controller 121, shirt 424 can be rotated in response to a multitouch input while texturizing portion 426 is dynamically changed to reflect the different surfaces or materials used in the product. Shirt 424 can be zoomed in and out using multitouch inputs detected by touch detectors 124 with each zoom level reflecting texture differences on portion 426. For instance, a zoomed in view can be more grainy or rough compared to a zoomed out view. The zoom levels can also be configured with a fading in or out effect by one or more processors 102 and can involve retrieving additional information from a server (not shown) over one or more network adapters 128. Moreover, if certain rare or uncommon materials cannot be replicated or simulated by texturizing portion 426, legend 425 identifies or associates different materials, such as rabbit skin, llama wool, and rare silk, by texturized portions $425_1$, $425_2$, and $425_3$, respectively. Beyond the examples of fabrics, other materials like metals, plastics, glass, wood, etc. can be replicated or simulated by texturizing portion 426.

Still referring to FIG. 4, an embodiment of the present invention provides an electronic game with elevated, indented, or texturizing portion 428 (hereinafter "portion 428"), such as tic-tac-toe. Portion 428 can detect different pressure forces when pushed down, pushed sideways, or pulled sideways providing another metric or feature for the man machine interface. These different pressure forces can be detected by pressure sensors 123 in combination with touch detectors 124 and/or display(s) elevation, indenting, or texturizing controller 121 by measuring gradient, force, or potential difference values of touches to raised portions in portion 428. Another gaming application comprises portion 428 emulating a piano or guitar.

Moreover, a game can receive as inputs flicks, pinches, or scratches to portion 428 and generate an action on display device 402 in response to each detected action differently. A pinch to a raised portion of 428 can represent an object or block being picked up or opened in a game or any other simulated environment. Portion 428 can also control scrolling or drag and drop functions in combination with multi-touch inputs detected by touch detectors 124. In another embodiment, certain portions 428 can be used as a miniature joystick or pointing stick for 360 degrees rotational input that is detected by pressure sensors 123 in combination with touch detectors 124 and/or display(s) elevation, indenting, or texturizing controller 121. A three dimensional accelerometer can be included in sensors 126 to be used in combination with display(s) elevation, indenting, or texturizing controller 121 to raise part of portion 428 in response to a programmed action in the game. Portion 428 can also be used to simulate or replicate a lottery scratching/rubbing game or a children's productivity game, as desired. Portion 428 can also provide a gaming feature where tilting or rotation detected by an accelerometer in sensors 126 raises some portions while indenting others for four dimensional motion gaming.

In another embodiment, portion 428 can provide online collaboration, online conferencing, social networking, or online dating. In response to push or pull input on a networked computing device (not shown) having an elevated, indented, or texturized display device, portion 428 provides feedback, similar to a poke on Facebook. In online conferencing, tactile inputs to portion 428 can be used during a video conference application for additional interaction between conversing parties. For social networking, adult entertainment can be enhanced by portion 428 providing stimulation in connection with a video, image, or audio media on display device 402.

Additional processes exist within the medical field for online collaboration. Portion 428 can provide remote medical diagnostics and measurements, such as a pressure test, over a network using one or more network adapters 128 and pressure sensors 123 in combination with touch detectors 124 and/or display(s) elevation, indenting, or texturizing controller 121. Diagnostics and measurements include tactile for motor skills, respiratory for testing lung pressure by a person blowing on portion 428, or muscular by measuring range of motion and strength, as desired. Therefore, portion 428 can provide bi-directional information exchange.

Still referring to medical processes, portion 428 can be used for the elderly or disabled to provide simple, small scale physical therapy exercises for the hand or fingers by allowing a user to pull raised portions at different tensions and resistances or pickup objects. This is particularly useful for stroke victims by providing mental therapy, exercises and massaging of small muscles and ligaments.

In another embodiment, portion 428 can be used to provide a plurality of processes or applications. Portion 428 can simulate maps, topography, geography, imagery, or location service processes in combination with GPS device 114. Portion 428 can display mountainous regions on a map by elevating and oceans by indenting. Portion 428 can follow a musical sequence being played on device 100 for a ringtone during a received call or song. Moreover, portion 428 can be used to display content in an email, 3rd Generation Partnership Project (3GPP) or 3GPP2 short message service (SMS) text message, 3GPP or 3GPP2 multimedia message service (MMS) message, an image or video motion in an MMS message, PDF application, word document, excel graphs, excel charts, four dimensional (4-D) screensaver, 4-D art, 4-D drawings, 3-D imagery, a 3-D sculpture, a 4-D "etch-a-sketch", or architecture designs using scalable or vector graphics. Any of the content given above and displayed by portion 428 may be transmitted or received over one or more network adapters 128.

Moreover, portion 428 can provide, replicate, or simulate integrated circuit layouts, electrical circuit layouts, facial features, enhanced video clips, computer aided designs (CAD), semiconductor layouts, prototyping, modeling, molding for producing form factors, logos, trademarks, a children's educational product, a general education product, a 3-D drawing tool, distance learning, or a pop-up children's books, as desired. In addition, portion 428 can be responsive to voice or visual commands or recognition detected by sensors 126 for being elevated, indented, or texturized.

Moreover, portion 428 can provide object awareness to display device 402. For instance, a post it note can be detected when it is determined that there is additional resistivity or elasticity by the adhesive on the post it note by pressure sensors 123 and in combination with touch detectors 124 and/or display(s) elevation, indenting, or texturizing controller 121 to raised or elevated cell in portion 428. In response to the detected post it, display device 402 can adapt and reformat the images around the note such that images are not obstructed to the user.

Moreover, portion 428 can provide advanced Bluetooth capabilities for Bluetooth keyboards, headsets and can function as a Bluetooth device itself for medical applications. When a call is received over one or more network adapters 128, a preprogrammed texturized pattern is reproduced on portion 428 for notifying the user, such as when display device 402 is in a shirt pocket in hands-free mode communicating with a wireless headset. Alternatively, the texturized pattern reproduced on portion 428 during an incoming call can be controlled, designed, or customized by the calling party if the function is enabled on device 100.

Figure 5:
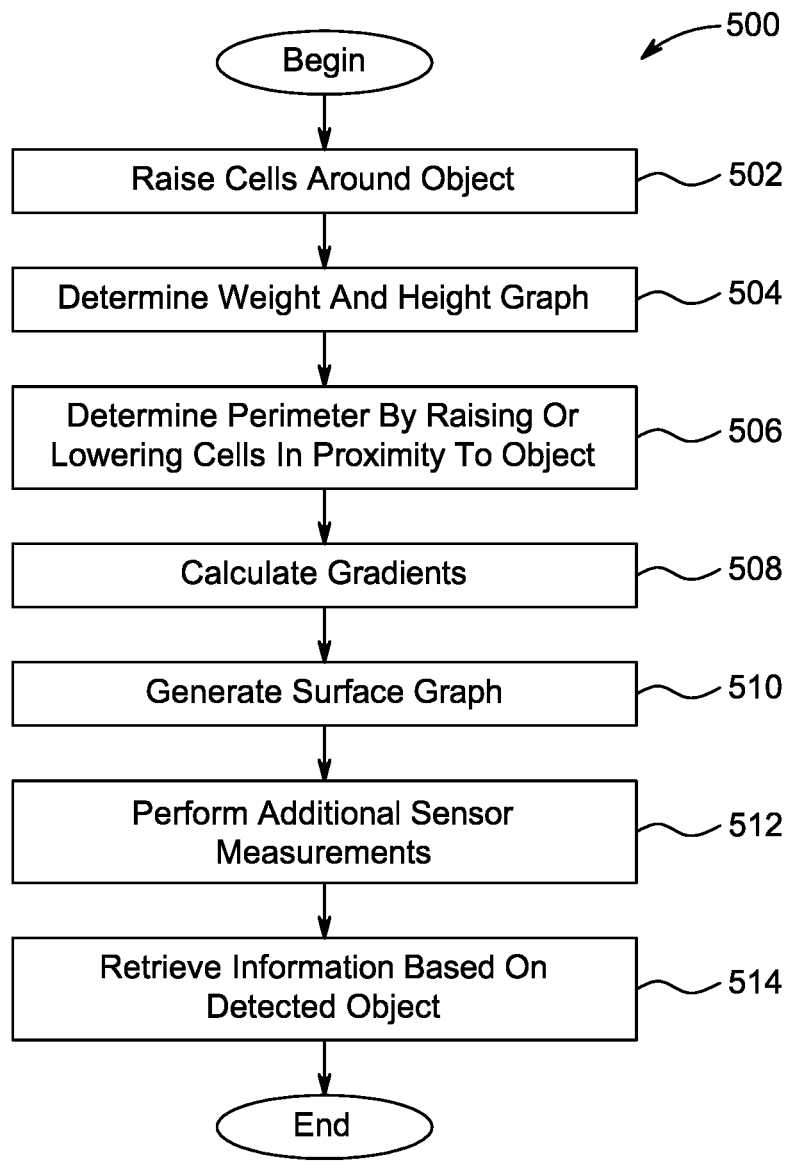
FIG. 5 is a process for detecting objects or shapes using a display device with an elevated, indented, or texturized display portions in accordance with another embodiment.

Still referring to FIG. 4, another embodiment provides object detection for a 3-D object that is placed on area 429 having a combination of elevated cells, indented cells, and/or texturized cells. FIG. 5 is a process 500 for detecting objects or shapes using elevated, indented, or texturized display portions. Although process 500 can be performed by device 100 in a fat client architecture, device 100 can also be configured as a thin client by sharing shape detection processing functions with a server (not shown) using one or more network adapters 128. Cells are selectively raised around an object placed on area 429 by display(s) elevation, indenting, or texturizing controller 121 (step 502). The weight of the object is detected by pressure sensors 123 and shape detectors 125 and a height graph of the surface of the object is generated by one or more processors 102 (step 504). The perimeter of the object placed on area 429 is determined by one or more processors 102 and shape detectors 125 by raising or lowering cells in proximity to object by display(s) elevation, indenting, or texturizing controller 121 (step 506). One or more processors 102 calculate gradients values (step 508) and generates a surface graph (step 510) based on the previous measurements made.

Moreover, display device 402 may have infrared detectors $430_1$-$430_4$ in a slightly beveled position or in the level with the frame of display device 402. Display device 402 may also have digital cameras $434_1$-$434_4$ for capturing, tracking, and detecting shapes using algorithms such as that described in U.S. Pat. No. 7,317,872, herein incorporated by reference as if fully set forth, that can be used to perform additional sensor measurements (step 512). Other sensor measurements for additional metrics and refinement include infrared or optical detection to detect depth. These sensors can be embedded next to or within each display cell in display device 402. Based on steps 502-512, a preliminary image may be rendered by one or more processors 102. The preliminary image can be compared and matched against a database of images in storage 110, or stored remotely, using artificial intelligence algorithms. Information is then retrieved by one or more network adapters 128 based on the detected object and/or preliminary image (step 514).

In a process involving area 429 and process 500, a ring size is detected and related information, such as from an online jewelry stored, is retrieved over one or more network adapters in response. Alternatively, the size and type of certain household goods, such as hardware, screws, nuts, light bulbs, batteries can be determined by area 429 and process 500. Moreover, a key placed on area 429 can be keyed and the information sent over one or more network adapters 128 for subsequent duplication and mail delivery by an online store. In addition, process 500 can be used to obtain biometric information for security purposes.

Figure 7:
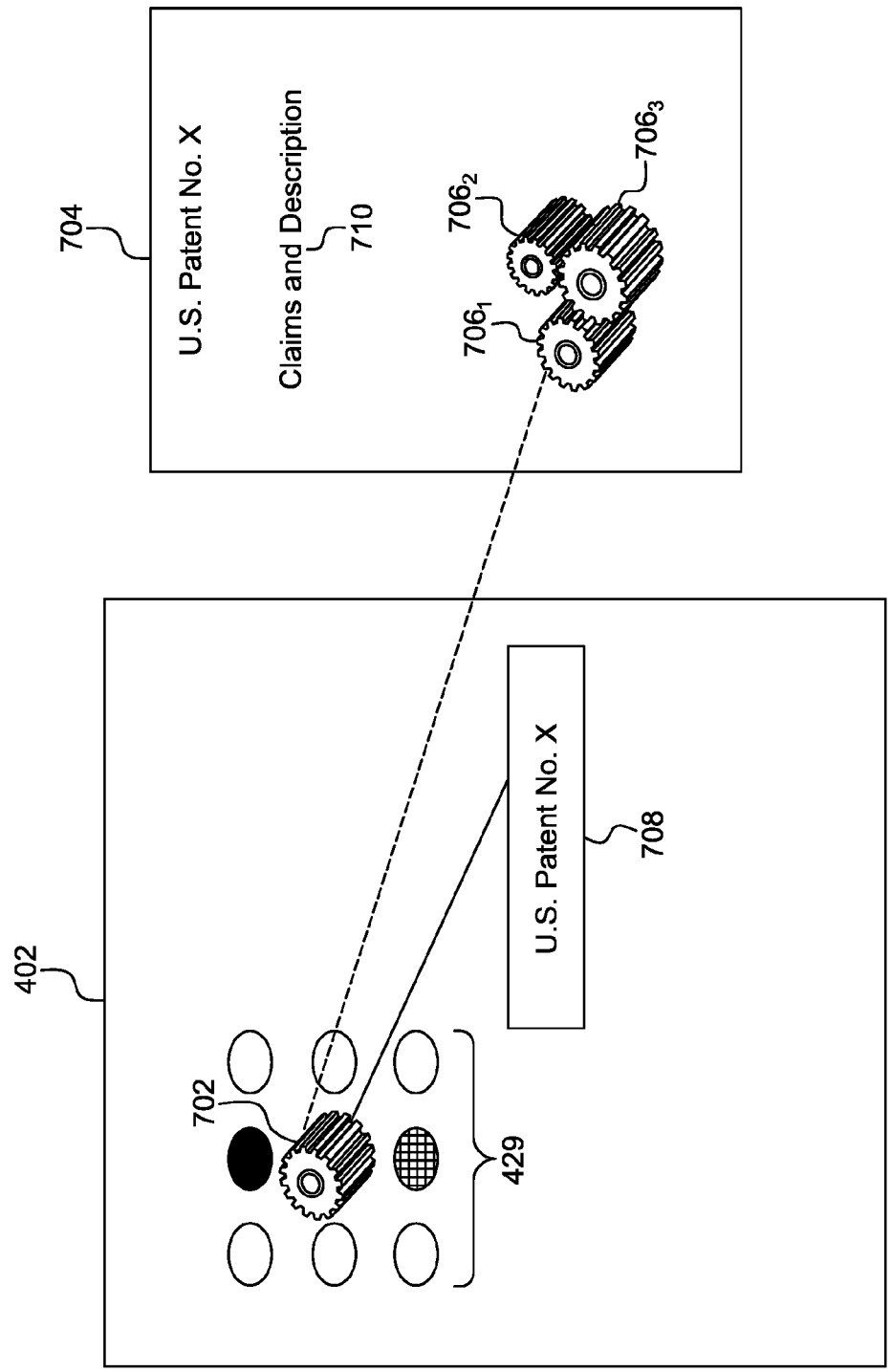
FIG. 7 is a process using an elevated, indented, or texturized display device for identifying intellectual property assets in accordance with another embodiment.

In another process involving area 429, intellectual property assets, such as patents, trademarks, or copyrights, relating to the shape of a detected object is retrieved and displayed in a map format in display device 402 to show a correspondence between similar features of an object and related intellectual property assets. FIG. 7 is a process using an elevated, indented, or texturized display device for identifying intellectual property assets. The shape of a widget 702 placed on area 429 is detected by process 500 and digitally rendered. The detected shape of the widget 702 is compared against widgets $706_1$, $706_2$, or $706_3$ shown and described in US Patent No. X (704) stored in a database. The comparison between widgets can be performed graphically using image rendering, as understood to one of ordinary skill in the art. Moreover, artificial intelligence algorithms can be used to compare claim text or descriptions 710 in US Patent No. X (704) against features detected by area 429 and process 500. If a match is determined or found, the widget 702 is associated with US Patent No. X (708) and displayed in a map format on display device 402.

In another embodiment, display device 402 replicates, mimics, or simulates a customizable or programmable interface or control panel for a remote control, instrument panel on a vehicle, an automobile dashboard configuration, audio equalizers, multitouch equalizers, radio button list, or a consumer electronics button surface with raised button portions $432_1$-$432_3$. The simulated interface can be used to sell consumer electronics or function as an advanced user guide whereby input, output, and programming functions are simulated with button portions $432_1$-$432_3$ that have the same size and shape as the actual buttons on a product. Moreover, $432_1$-$432_3$ can be programmed for controlling volume control, replicating smart home switches or controllers, as desired.

Still referring to FIG. 4, advanced web searching 436 is performed by measuring pressure applied or detecting depth perception to raised or elevated portion 438. Web searching 436 can be used in combination with area 429 to display hits or webpages relevant to detected objects.

Figure 6:
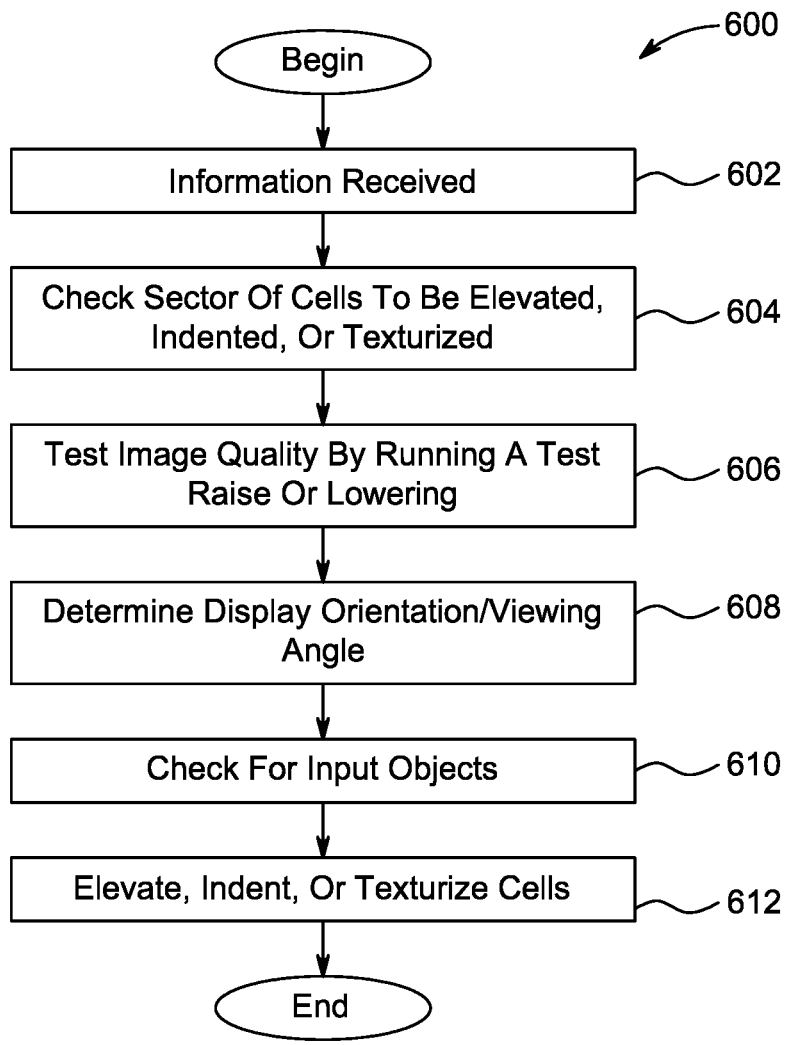
FIG. 6 is a process using an elevated, indented, or texturized display device in accordance with another embodiment.

FIG. 6 is a process 600 using an elevated, indented, or texturized display device that can be selectively performed by the display devices described above. Information is received from one or more network adapters 128, I/O devices 118, or storage device 110 (step 602). The sector of cells to be elevated, indented, or texturized based on the received information is checked and tested by display(s) elevation, indenting, or texturizing controller 121 and display controllers 120 (step 604) to determine how a high image quality in the area can be maintained (step 606) by raising or lowering selective cells. One or more processors 102 in combination with sensors 126 determine display orientation or viewing angle (step 608) that is taken into consideration to properly elevate, indent, or texturize the display devices described above. If an image of an object is to be simulated or replicated, it is rendered by one or more processors 102 and checked to determine if it can be properly displayed (step 610). The cells in the display device are elevated, indented, or texturized (step 612).

Although features and elements are described above in particular combinations, each feature or element can be used alone without the other features and elements or in various combinations with or without other features and elements. The methods, processes, or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, digital versatile disks (DVDs), and BluRay discs.

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a computer, wireless transmit receive unit (WTRU), user equipment (UE), terminal, base station, radio network controller (RNC), or any host computer. The WTRU may be used in conjunction with modules, implemented in hardware and/or software, such as a camera, a video camera module, a videophone, a speakerphone, a vibration device, a speaker, a microphone, a television transceiver, a hands free headset, a keyboard, a Bluetooth® module, a frequency modulated (FM) radio unit, a liquid crystal display (LCD) display unit, an organic light-emitting diode (OLED) display unit, a digital music player, a media player, a video game player module, an Internet browser, and/or any wireless local area network (WLAN) or Ultra Wide Band (UWB) module.

What is claimed is:

1. A mobile electronic device comprising:
    a multi-touch display, of the mobile electronic device, configured to display an image, wherein a tactile area on a substantially clear layer proximate to the multi-touch display is associated with the image;
    a processor configured to display, on the multi-touch display, an information view based on force from a detected touch to the tactile area and a detected indentation level of the substantially clear layer, wherein the force is detected by a sensor layer substantially behind the multi-touch display; and
    the processor configured to display a detailed view of the information view based on a detected further indentation of the tactile area.

2. The mobile electronic device of claim 1 further comprising:
    the mobile electronic device is configured to provide a programmable vibration in relation to a zoom operation of the image.

3. The mobile electronic device of claim 1 further comprising:
    circuitry configured to raise, by the mobile electronic device, the tactile area to a height substantially above the multi-touch display.

4. The mobile electronic device of claim 1, wherein a vibration or a texture pattern is provided in association with the detected further indentation.

5. The mobile electronic device of claim 1, wherein the multi-touch display is a flexible OLED display.

6. A method performed by a mobile electronic device, the method comprising:
    displaying, by a multi-touch display of the mobile electronic device, an image, wherein a tactile area on a substantially clear layer proximate to the multi-touch display is associated with the image;
    displaying, on the multi-touch display, an information view based on force from a detected touch to the tactile area and a detected indentation level of the substantially clear layer, wherein the force is detected by a sensor layer substantially behind the multi-touch display; and
    displaying a detailed view of the information view based on a detected further indentation of the tactile area.

7. The method of claim 6 further comprising:
    providing, by the mobile electronic device, a programmable vibration in relation to a zoom operation of the image.

8. The method of claim 6 further comprising:
    raising, by the mobile electronic device, the tactile area to a height substantially above the multi-touch display.

9. The method of claim 6, wherein a vibration or a texture pattern is provided in association with the detected further indentation.

10. The method of claim 6, wherein the multi-touch display is a flexible OLED display.

11. A mobile electronic device comprising:
    a multi-touch display, of the mobile electronic device, configured to display text, wherein a tactile point on a substantially clear layer proximate to the multi-touch display is associated with the text;
    a processor configured to display, on the multi-touch display, a view based on force from a detected touch to the tactile point and a detected indentation level of the substantially clear layer, wherein the force is detected in part by a sensor layer of the mobile electronic device and the indentation is detected in part based on motion of the mobile electronic device; and
    the processor configured to display a detailed view of the view based on a detected further indentation of the tactile point.

* * * * *